Feb. 18, 1969 KAZUO MAEDA 3,428,500

PROCESS OF EPITAXIAL DEPOSITION ON ONE SIDE OF A SUBSTRATE WITH SIMULTANEOUS VAPOR ETCHING OF THE OPPOSITE SIDE

Filed April 21, 1965

United States Patent Office 3,428,500
Patented Feb. 18, 1969

3,428,500

PROCESS OF EPITAXIAL DEPOSITION ON ONE SIDE OF A SUBSTRATE WITH SIMULTANEOUS VAPOR ETCHING OF THE OPPOSITE SIDE

Kazuo Maeda, Chigasaki-shi, Japan, assignor to Fujitsu Limited, Kawasaki, Japan, a corporation of Japan Filed Apr. 21, 1965, Ser. No. 449,761
Claims priority, application Japan, Apr. 25, 1964, 39/23,375
U.S. Cl. 148—175 5 Claims
Int. Cl. H01l 7/00

ABSTRACT OF THE DISCLOSURE

Described is a method of producing semiconductor crystalline members. The method comprises placing a semiconductor crystalline substrate and a semiconductor crystalline source face-to-face adjacent to each other with an interspace of more than 10 and less than 200 micron width, heating said substrate and source in a reaction vessel to transport reaction temperature with the source at a higher temperature than the substrate, passing at said temperature a mixture of carrier gas and an adjusted concentration of active gas through the vessel and thereby growing an epitaxial layer on the source side of the substrate and simultaneously etching material away from the opposite side of the substrate. As a result, a thick epitaxial layer is grown on the source side of said substrate, and said substrate is so reduced in thickness as to form a thin layer of the resulting semiconductor member.

My invention relates to semiconductor crystalline members, particularly those containing an epitaxially produced p-n junction. In a more particular aspect, my invention relates to a method of growing an epitaxial layer upon a monocrystalline substrate by gaseous-phase reaction.

Epitaxial thin films of various semiconductor materials, including silicon, are finding increasing use as a material for transistors, diodes, integrated circuits and other solid-state components.

The epitaxial technique, employing a gaseous-phase growth, is superior to the liquid-phase process, such as the production of crystalline members by pulling them out of a melt or by zone melting, with respect to the ease with which layers of a desired conductance type, specific resistance and thickness can be obtained.

However, when the semiconductor member has an electrode of large area and is required to conduct a relatively high amount of power and to possess a high breakdown voltage, or in cases where the composition of the material is complicated, the requirement for completeness and perfection of the crystal structure pose a great problem. Comprehensive research has shown that crystals grown from the gaseous phase tend to exhibit more imperfections, such as stacking faults or dislocations, than crystals obtained by the liquid-phase process, and it is also more difficult to obtain favorable p-n junctions. Hence as to the degree of perfection attainable in the crystals, those with epitaxial layers grown by a gaseous-phase process are generally inferior and still leave much to be desired.

It is an object of my invention to devise an epitaxial crystal growing process for the production of semiconductor members, that improves the crystals with respect to the desired degree of perfection and thus minimizes or virtually overcomes the problems heretofore encountered.

According to the invention, I virtually inverse the conventional gaseous-phase epitaxial growing process by using as substrate a semiconductor wafer made from the liquid (molten) phase and having substantially the specific resistance desired in the thin layer or film of the semiconductor member or device to be produced. I epitaxially grow on such a substrate a layer and continue the growing process until this gaseous-process layer is so thick that it becomes usable as a base or support of the finished semiconductor member. At the same time, namely during the growing process, I employ the same gaseous phase for etching so much away from the original wafer, made by a liquid-phase process, that the remaining residue constitutes the above-mentioned thin layer or film of the finished product.

In this manner, the resulting semiconductor members or devices exhibit superior characteristics, and the production itself becomes more uniform and affords a better economical yield.

In a known inverse epitaxial process, a gaseous-phase growth layer is produced on a substrate and given a relatively large thickness. Thereafter, the original substrate is polished mechanically and chemically from the opposite side in order to reduce it to a given thickness. This method has marked deficiences because the time required for the epitaxial growth is excessively long, the economy of the process is poor, the in-diffusion of impurities poses a grave problem. The necessity of polishing the product after finishing the growing operation renders the process complicated; and it is difficult to control the remaining thickness of the substrate so that it is accurately parallel to the epitaxial layer and precisely exhibits the desired value of thickness.

It is therefore another, more specific object of my invention to complete within a single process the formation of an epitaxial layer by gaseous-phase growth and to also afford an accurate control of the remaining substrate thickness by gaseous-phase etching.

Another object is to perform this process in substantially the same manner as the conventional epitaxial growing process and to complete the entire process in a shorter period of time, particularly by fully eliminating the need for subsequent polishing.

To achieve these objects and in accordance with my invention, a substrate semiconductor crystal and another semiconductor crystal to serve as a source are placed face-to-face adjacent to each other with an interspace of more than 10 microns but less than 200 microns. This assembly of substrate and source is charged into a reaction vessel, preferably a tube, with the source situated near the heater element so as to become heated to a higher temperature than the substrate. While a proper temperature difference is thus produced and maintained between the two semiconductor sheets or wafers of crystal, a mixture of gas which comprises halogen or hydrogen halide, is passed through the processing vessel. As a result, an epitaxial layer is grown on the source-side of the substrate and simultaneously the opposite surface of the substrate is subjected to gaseous-phase etching.

The gas thus being passed through the reaction vessel is composed of a carrier gas and an active gas. Hydrogen is best suitable as a carrier gas, although an inert gas such as nitrogen or helium may also be used for this purpose. The active gas, serving to provide for the growth reaction as well as the etching reaction, may consist of either one or more of hydrogen halide, such as hydrogen chloride (HCl), hydrogen bromide (HBr) and hydrogen iodide (HI) or halogen, such as chlorine, bromine and iodine.

The method is applicable to various semiconductor materials such as silicon, germanium and semiconductor compounds, for example GaAs and GaP.

The invention will be further explained with reference to the accompanying drawing in which.

Figure 1:
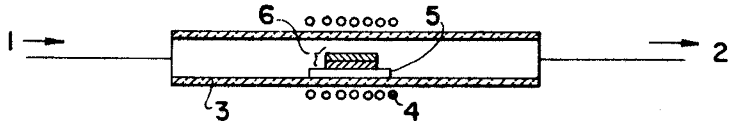
FIG. 1 shows schematically and in section a device for performing the method according to the invention.

Referring to the processing device illustrated in FIG. 1, a mixture of carrier gas and active gas purified by dehydration and deoxidation, is supplied at 1 into and through a tubular processing vessel 3 of quartz, the waste gases leaving the tube as shown at 2. The middle portion of the tubular vessel 3 is surrounded by a high-frequency heater coil 4. Placed into the vessel and within the heating area of the coil 4 is a base 5 consisting of a heating element of graphite or silicon carbide which has a planar top surface upon which a substrate crystal and a growth-source crystal are deposited at 6 in the manner shown more in detail in FIG. 2.

The growth-source crystal 7 is placed flat on top of the heater element 5 and is separated from the substrate wafer 6 by an intermediate spacer 8 of graphite, quartz or the same semiconductor material as the one of which the source or substrate consists. The spacer 8 may have any desired shape, for example the shape of a ring if the source 7 and the substrate 6 are shaped as circular discs. The space between source 7 and substrate should be more than 10 microns but not more than 200 microns for reasons explained hereinafter.

Figure 2:
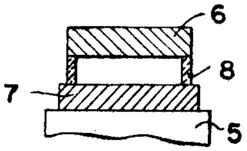
FIG. 2 shows schematically and in section an assembly of substrate and source wafers at the beginning of the process.

With the assembly according to FIG. 2 placed into the processing vessel 3, the temperature of the heater element 5 is raised by means of the heater 4 to the processing temperature, for example 1100° C. if the semiconductor material being processed is silcon. The heating may also be effected in any other suitable manner, for example by directly passing electric current through the heater element 5. The surface temperature of the substrate 6 is measured by means of an optical pyrometer. The proper temperature difference between substrate and source crystals is 20° to 50° C. for an interspace of 10 to 200 microns.

With the source and substrate heated to the proper temperature, the mixture of carrier gas and active gas in the proper concentration is passed through the tubular processing vessel. A regulation of the flow velocity is unnecessary because the reaction produced by this method is not appreciably influenced by the rate of gas flow.

Figure 3:
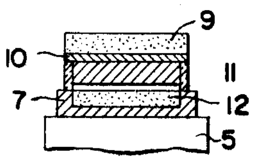
FIG. 3 is an explanatory illustration of the conditions obtaining at the termination of the process.

With substrate 6 and source 7 held at the chosen temperature while maintaining a flow of gas for a given length of time, a chemical transport reaction from source 7 to substrate 6 takes place and transfers material from the top of source 7 to the bottom surface of the substrate. As a result, a layer 11 is epitaxially grown on the bottom surface of the substrate. At the same time an amount of material is removed at 9 (FIG. 3) by gaseous-phase etching due to the effect of the active gas, so that the thickness of the substrate is gradually reduced until only a residual layer 10 of the desired ultimate thickness is left.

As will be more fully explained hereinafter, the thickness of the grown epitaxial layer 11 and the thickness of the remaining substrate layer 10 are determined by the rate of growth on the one hand and by the rate of etching on the other hand, both being dependent upon the reaction conditions applied, namely upon the concentration of the active gas, but not dependent upon the velocity of the gas flow or upon maintenance of particular spacial conditions, as will more fully appear from the following explanations in conjunction with FIG. 5.

Figure 4:
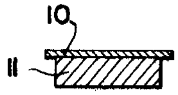
FIG. 4 shows schematically a semiconductor member as produced by the process.

Thus, by selecting proper conditions, the thickness of the remaining layer 10 (FIG. 4) and the thickness of the epitaxially grown layer 11 are readily controllable at will, and a semiconductor crystaline member as shown in FIG. 4 is obtainable in a single operation. It will be noted that in FIG. 4 the grown layer 11 is much thicker, namely more than three times thicker that the remaining substrate layer 10.

Within the range of 10 microns to 200 microns interspace between substrate 6 and growth source 7, the rate of growth and the rate of etching are virtually independent of the width of this interspace. If the interspace is made narrower than 10 microns, a growth of dendritic character occurs between the two wafers and the resulting crystal exhibits a bad epitaxial constitution. On the other hand, when the width of the interspace is increased beyond 200 microns, the temperature of the substrate crystal 6 changes abruptly and so appreciably that the rate of growth becomes too low.

The impurity concentration of the growth source 7 remains substantially preserved in the resulting grown layer 11. It is advisable therefore to select and use a source material whose specific resistance corresponds to the one desired in the epitaxial layer to be grown.

Since contrary to conventional reduction methods, a gas of high impurity concentration is not employed, it is unnecessary to provide for special expedients in order to prevent contamination from components of the furnace or other sources. Furthermore, it is not absolutely necessary to employ monocrystalline source. Even if a polycrystal is used for this purpose, the same result is obtained and the grown layer assumes monocrystalline constitution.

Figure 5:
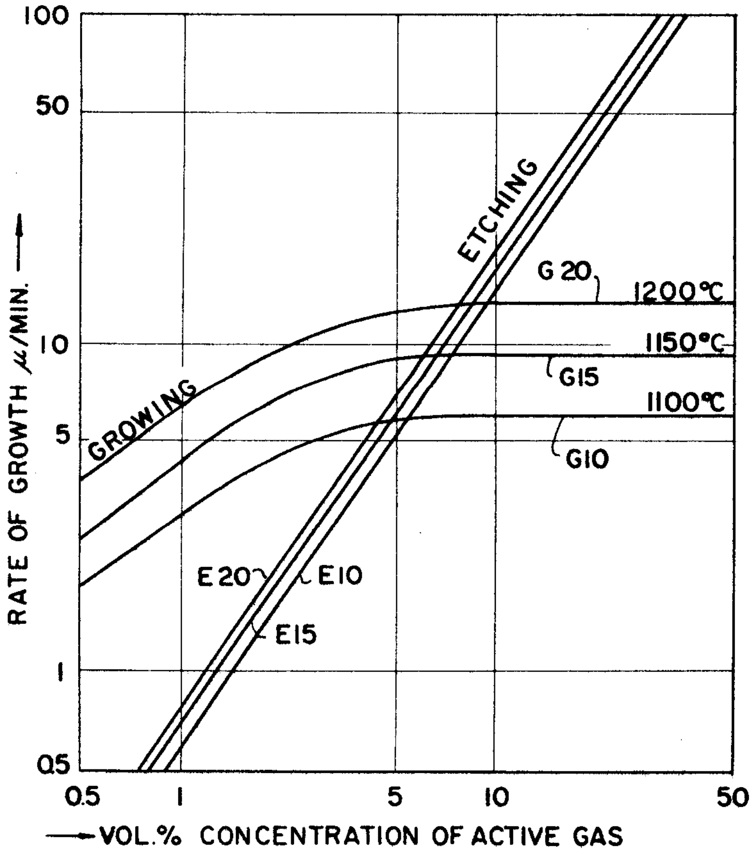
FIG. 5 is a graph showing two groups of correlated curves obtained from measuring results.

The graph shown in FIG. 5 represents the rate of gaseous phase etching in relation to the rate of growth with respect to silicon in a hydrogen-bromine system. The thickness of the etched or grown layer is plotted along the ordinate in micron per minute, and the concentration of the active gas is given along the abscissa. As exemplified by the graph, the concentration of the active gas is preferably more than 1% up to about 15%. The respective curves E10, E15, E20 and G10, G15, G20 apply to respectively different temperature values as parameters. For example, suppose that the concentration of the active gas is 10% and the temperature is 1100° C. In this case, the epitaxial layer 11 grows 6 micron per minute (curve G10) and the substrate is etched to a depth of 15 microns per minute (curve E10). It will be seen that if the concentration and the reaction temperature of the active gas are predetermined or chosen, both rates are also determined. Accordingly, by properly selecting a combination of both rates, as wel las the original thickness of the substrate (6 in FIG. 2), the epitaxially grown layer and the remaining layer of the substrate can be given any desired value within the available limits.

However, if it is desired to make the remaining layer (10 in FIG, 4) very thin in comparison with the epitaxially grown layer 11, it is advisable to select the thickness of the growth-source wafer beforehand in accordance with the desired thickness of the grown epitaxial layer, and to transfer all of the source to the substrate. Only the gaseous-phase etching need then be controlled by selecting a corresponding period of processing time.

In this manner, the desired semiconductor crystal is produced in a single operation. Usually the required amount of time is 20 to 30 minutes. If it is desired to complete the production in a shorter time, the process can also be carried out within as little as 10 to15 minutes.

The remaining thickness of the substrate is uniform and the surface is even. The surface of the grown epitaxial layer is likewise distinguished by uniformity, assuming that the original interspace between substrate and source is more than 10 microns. Consequently, the resulting crystalling structure, as schematically shown in FIG. 4, is immediately applicable for assembly with electrodes and other components into a device.

A specific example of the production according to the invention will be described presently. A p-type silicon monocrystalline wafer of 232 microns thickness was used as a substrate (6 in FIG. 2). An n-type silicon polycrystal ohm cm., was used as growth source (7 in FIG. 2). Both wafer of 400 microns having a specific resistance of 0.0038 were charged into a reaction tube as shown in FIG. 1 with an interspace of 75 microns.

The heating element (5 in FIGS. 1, 2) employed consisted of graphite coated with silicon carbide. The assembly placed into the reaction tube was first heated in hydrogen until the substrate reached the temperature of 1150° C. From then on, a gas mixture of hydrogen with 7.0% of bromine was passed through the tube to perform the reaction. The temperature difference between substrate and source during the reaction was 50° C. The reaction was performed for 20 minutes. Thereafter the assembly was permitted to cool to room temperature. The two crystals were separated. The thickness of the substrate had changed to 215 microns, and the thickness of the polycrystalline source had decreased to 219 microns.

Accordingly, it was expected that a thickness of 181 microns had been transferred from the source to the substrate and that the substrate was reduced to a thickness of 34 microns.

The manufactured semiconductor crystal was transversely cut, and the sections were examined. The grown epitaxial layer was found to be 180 microns thick, and the residual layer of the substrate was 35.5 microns thick, this being in good coincidence with the expected values. The etching rate was 9.8 microns per minute and the rate of growth 9.0 microns per minute, in good coincidence with the data given in FIG. 5. The specific resistance of the grown layer was 0.0052 ohm cm.

By virtue of the invention, the yield of producing semiconductor members for high-power transistors and other solid-state circuit components, integrated circuits and the like, is markedly improved and since a polycrystalline material can be used as a growth source, it is unnecessary to control the thickness by polishing or other means. As a result, the process according to the invention also constitutes a considerable simplification and improves the economy of production.

I claim:

1. The method of producing semiconductor crystalline members, which comprises placing a semiconductor crystalline substrate of a predetermined thickness, whereby after vapor deposition and simultaneous vapor etching, said thickness will be so reduced that said substrate will constitute a thin layer of said semiconductor member and a semiconductor crystalline source face-to-face adjacent to each other with an interspace of more than 10 and less than 200 microns width, heating said substrate and source in a reaction vessel to transport reaction temperature with the source at a higher temperature than the substrate, passing at said temperature a mixture of carrier gas selected from hydrogen, nitrogen and inert gas and active gas selected from chlorine, bromine, iodine, hydrogen chloride, hydrogen bromide and hydrogen iodide through the vessel, adjusting the concentration of the active gas so as to obtain a predetermined rate of growth on the substrate surface facing the source and a correlated rate of etching of material from the opposite side of said substrate, whereby a thick epitaxial layer is grown on the source side of said substrate, and said substrate itself is so reduced in thickness so as to form a thin layer of the resulting semiconductor member.

2. The method of claim 1, wherein a gaseous mixture of hydrogen and hydrogen halide is used.

3. The method of producing semiconductor crystalline members according to claim 1, wherein said source is a wafer of polycrystalline material.

4. The method of claim 1, wherein the substrate is of one conductivity and the source is of opposite conductivity.

5. The method of producing semiconductor crystalline members, which comprises placing a semiconductor crystalline substrate of silicon of a predetermined thickness, whereby after vapor deposition and simultaneous vapor etching, said thickness will be so reduced that said substrate will constitute a thin layer of said semiconductor member and a semiconductor crystalline source in face-to-face relation with an interface of more than 10 and less than 200 microns width, said substrate and source having different types of conductance respectively, heating said substrate and source in a reaction vessel to transport reaction temperature of about 1100° C. to about 1200° C. with the source at about 20° to about 50° C. above the substrate temperature, passing at said temperature a mixture of hydrogen and active gas through the vessel, said active gas being at least one selected from the group consisting of Cl, Br, I, HCl, HBr and HI, and adjusting the concentration of said active gas from more than 1% up to about 15% concentration so as to obtain a predetermined rate of growth on the substrate surface facing the source and a correlated rate of etching of material from the opposite side of said substrate, whereby a thick epitaxial layer is grown on the source side of said substrate, and said substrate itself is so reduced in thickness so as to form a thin layer of the resulting semiconductor member.

References Cited

UNITED STATES PATENTS

| | | | |
|---|---|---|---|
| 3,142,596 | 7/1964 | Theverer | 148—175 |
| 3,172,792 | 3/1965 | Handelman | 148—175 |
| 3,243,323 | 3/1966 | Corrigan et al. | 148—175 |
| 3,291,657 | 12/1966 | Sirtl | 148—175 |
| 3,316,130 | 4/1967 | Dash et al. | 148—175 |
| 3,261,727 | 7/1966 | Dehmelt et al. | 148—175 |
| 3,341,374 | 9/1967 | Sirtl | 148—175 |
| 3,366,520 | 1/1968 | Berkenblit et al. | 156—17 |

FOREIGN PATENTS

| | | |
|---|---|---|
| 1,364,522 | 7/1963 | France. |
| 1,374,096 | 11/1963 | France. |

OTHER REFERENCES

IBM Technical Disclosure Bulletin, vol. 5, No. 12, May 1963, pp. 6–7.

L. DEWAYNE RUTLEDGE, *Primary Examiner.*

PAUL WEINSTEIN, *Assistant Examiner.*

U.S. Cl. X.R.

117—106, 201; 148—174; 156—17